(12) United States Patent
Scheuerlein et al.

(10) Patent No.: US 6,765,813 B2
(45) Date of Patent: Jul. 20, 2004

(54) INTEGRATED SYSTEMS USING VERTICALLY-STACKED THREE-DIMENSIONAL MEMORY CELLS

(75) Inventors: Roy E. Scheuerlein, Cupertino, CA (US); J. James Tringali, Los Altos, CA (US); Colm P. Lysaght, Palo Alto, CA (US); Alper Ilkbahar, San Jose, CA (US); Christopher S. Moore, San Jose, CA (US); David R. Friedman, Menlo Park, CA (US)

(73) Assignee: Matrix Semiconductor, Inc., Santa Clara, CA (US)

( * ) Notice: Subject to any disclaimer, the term of this patent is extended or adjusted under 35 U.S.C. 154(b) by 0 days.

(21) Appl. No.: 10/185,588

(22) Filed: Jun. 27, 2002

(65) Prior Publication Data

US 2002/0163834 A1 Nov. 7, 2002

Related U.S. Application Data

(63) Continuation-in-part of application No. 09/638,334, filed on Aug. 14, 2000, now Pat. No. 6,545,891.
(60) Provisional application No. 60/308,330, filed on Jul. 26, 2001.

(51) Int. Cl.$^7$ ................................................. G11C 5/02
(52) U.S. Cl. ............................ 365/51; 365/52; 365/63
(58) Field of Search ......................... 365/51, 52, 63, 365/130, 185.04, 104, 94; 361/735, 803

(56) References Cited

U.S. PATENT DOCUMENTS

| | | |
|---|---|---|
| 4,272,880 A | 6/1981 | Pashley |
| 4,442,507 A | 4/1984 | Roesner |
| 4,489,478 A | 12/1984 | Sakurai |
| 4,498,226 A | 2/1985 | Inoue et al. |
| 4,499,557 A | 2/1985 | Holmberg et al. |

(List continued on next page.)

FOREIGN PATENT DOCUMENTS

| | | |
|---|---|---|
| WO | WO 99/14763 | 3/1999 |

OTHER PUBLICATIONS

Zhang, Ph.D., Guobiao, "*Three–Dimensional Read–Only Memory (3D–ROM),*" presentation from website zhangpatents, pp. 1–29.

Zhang, Ph.D., Guobiao, "*3D–ROM—A First Practical Step Towards 3D–IC*" Semiconductor International, Jul. 2000, from website zhangpatents, pp. 1–7.

"MultiMediaCard System Specification Version 2.2 Official Release," pp. 10, 12, and 14, Jan., 2000.

(List continued on next page.)

*Primary Examiner*—David Lam
(74) *Attorney, Agent, or Firm*—Brinks Hofer Gilson & Lione

(57) ABSTRACT

Support circuitry for a three-dimensional memory array is formed in a substrate at least partially under the three-dimensional memory array and defines open area in the substrate under the three-dimensional memory array. In one preferred embodiment, one or more memory arrays are formed at least partially in the open area under the three-dimensional memory array, while in another preferred embodiment, logic circuitry implementing one or more functions is formed at least partially in the open area under the three-dimensional memory array. In yet another preferred embodiment, both one or more memory arrays and logic circuitry are formed at least partially in the open area under the three-dimensional memory array. Other preferred embodiments are provided, and each of the preferred embodiments can be used alone or in combination with one another.

35 Claims, 9 Drawing Sheets

U.S. PATENT DOCUMENTS

| | | | |
|---|---|---|---|
| 4,646,266 A | 2/1987 | Ovshinsky et al. | |
| 4,677,742 A | 7/1987 | Johnson | |
| 5,029,125 A | 7/1991 | Sciupac | |
| 5,070,384 A | 12/1991 | McCollum et al. | |
| 5,249,282 A | 9/1993 | Segers | |
| 5,283,759 A | 2/1994 | Smith | |
| 5,285,323 A | 2/1994 | Hetherington et al. | |
| 5,306,935 A | 4/1994 | Esquivel et al. | |
| 5,427,979 A | 6/1995 | Chang | |
| 5,441,907 A | 8/1995 | Sung et al. | |
| 5,515,333 A | 5/1996 | Fujita et al. | |
| 5,535,156 A | 7/1996 | Levy et al. | |
| 5,553,019 A | 9/1996 | Sandvos et al. | |
| 5,561,622 A * | 10/1996 | Bertin et al. | 365/51 |
| 5,561,628 A | 10/1996 | Terada et al. | |
| 5,568,361 A | 10/1996 | Ward et al. | |
| 5,602,987 A | 2/1997 | Harari et al. | |
| 5,640,343 A | 6/1997 | Gallagher et al. | |
| 5,699,317 A | 12/1997 | Sartore et al. | |
| 5,721,862 A | 2/1998 | Sartore et al. | |
| 5,745,407 A | 4/1998 | Levy et al. | |
| 5,812,418 A | 9/1998 | Lattimore et al. | |
| 5,818,748 A | 10/1998 | Bertin et al. | |
| 5,835,396 A | 11/1998 | Zhang | |
| 5,856,221 A | 1/1999 | Clementi et al. | |
| 5,877,975 A | 3/1999 | Jigour et al. | |
| 5,889,694 A | 3/1999 | Shepard | |
| 5,911,104 A | 6/1999 | Smayling et al. | |
| 5,943,254 A | 8/1999 | Bakeman et al. | |
| 6,034,882 A | 3/2000 | Johnson et al. | |
| 6,104,628 A | 8/2000 | Sugibayashi | |
| 6,124,157 A | 9/2000 | Rahim | |
| 6,131,140 A | 10/2000 | Rodgers et al. | |
| 6,160,718 A | 12/2000 | Vakilian | |
| 6,185,122 B1 | 2/2001 | Johnson et al. | |
| 6,207,991 B1 | 3/2001 | Rahim | |
| 6,208,545 B1 | 3/2001 | Leedy | |
| 6,259,132 B1 | 7/2001 | Pio | |
| 6,263,398 B1 | 7/2001 | Taylor et al. | |
| 6,266,272 B1 | 7/2001 | Kirihata et al. | |
| 6,378,118 B1 | 4/2002 | Sugibayashi | |
| 6,420,215 B1 | 7/2002 | Knall et al. | |
| 6,424,581 B1 | 7/2002 | Bosch et al. | |
| 6,545,891 B1 | 4/2003 | Tringali et al. | |

OTHER PUBLICATIONS

"A 10ns Read and Write Non–Volatile Memory Array Using a Magnetic Tunnel Junction and FET Switch in each Cell," Scheuerlein et al., ISSCC 2000/Session 7/TD: Emerging Memory & Device Technologies/Paper TA 7.2, 4 pages, Feb. 8, 2000.

"A 125mm$^2$/Gb NAND Flash Memory with 10MB/s Program Throughout," Nakamura et al., ISSCC 2002/Session 6/SRAM and Non–Volatile Memories/6.4, 10 pages (Dec. 4, 2002).

"Three–Dimensional Memory Array and Method of Fabrication," Johan Knall, U.S. App. Ser. No. 09/560,626 filed Apr. 28, 2002.

"Method for Deleting Stored Digital Data from Write–Once Memory Device," Christopher S. Moore, Derek J. Bosch, Daniel C. Steere, J. James Tringali, U.S. patent application Ser. No. 09/638,439 filed Aug. 14, 2002.

"Memory Device with Row and Column Decoder Circuits Arranged in a Checkerboard Pattern under a Plurality of Memory Arrays," Roy E. Scheuerlein, U.S. patent application Ser. No. 09/896,814 filed Jun. 29, 2001.

"Memory Devices and Methods for Use Therewith," Roger W. March, Christopher S. Moore, Daniel Brown, Thomas H. Lee, Mark G. Johnson, U.S. patent application Ser. No. 09/748,589 filed Dec. 22, 2000.

"Method for Reading Data in Write–Once Memory Device Using a Write–Many File System," Christopher S. Moore, J. James Tringali, Roger W. March, James E. Schneider, Derek J. Bosch, Daniel C. Steere, U.S. patent application Ser. No. 09/878,138 filed Jun. 8, 2001.

"Method for Re–Directing Data Traffic in a Write–Once Memory," J. James Tringali, Christopher S. Moore, Roger W. March, James E. Schneider, Derek J. Bosch, Daniel C. Steere, U.S. patent application Ser. No. 09/877,691 filed Jun. 8, 2001.

"Memory Device and Method for Storing and Reading Data in a Write–Once Memory Array," Christopher S. Moore, James E. Schneider, J. James Tringali, Roger W. March, U.S. patent application Ser. No. 09/877,720 filed Jun. 8, 2001.

"Memory Device and Method for Storing and Reading a File System Structure in a Write–Once Memory Array," Christopher S. Moore, James E. Schneider, J. James Tringali, Roger W. March, U.S. patent application Ser. No. 09/877,719 filed Jun. 8, 2001.

"Method for Storing Digital Information in Write–Once Memory Array," David R. Friedman, Derek J. Bosch, Christopher S. Moore, Joseph J. Tringali, Michael A. Vyyoda, U.S. patent application Ser. No. 09/727,229 filed Nov. 30, 2000.

"Modular Memory Device," J. James Tringali, P. Michael Farmwald, Thomas H. Lee, Mark G. Johnson, Derek J. Bosch, U.S. patent application Ser. No. 09/638,334 filed Aug. 14, 2000.

"Low–Cost Three–Dimensional Memory Array," Mark G. Johnson, Thomas H. Lee, Vivek Subramanian, P. Michael Farmwald, N. Johan Knall, U.S. patent application Ser. No. 09/928,969 filed Aug. 13, 2001.

Douglas, John H., "*The Route To 3–D Chips*", High Technology, Sep. 1983, vol. 3, No. 9, pp. 55–59.

Edited by Cappelletti, Paulo et al., "*Flash Memories*", Kluwer Academic Publishers, 1999.

Kawashima, Shoichiro et al., "*A Charge–Transfer Amplifier and an Encoded–Bus Architecture for Low–Power SRAM's*", IEE Journal of Solid–State Circuits, vol. 33, No. 5, May 1998, pp. 793–799.

* cited by examiner

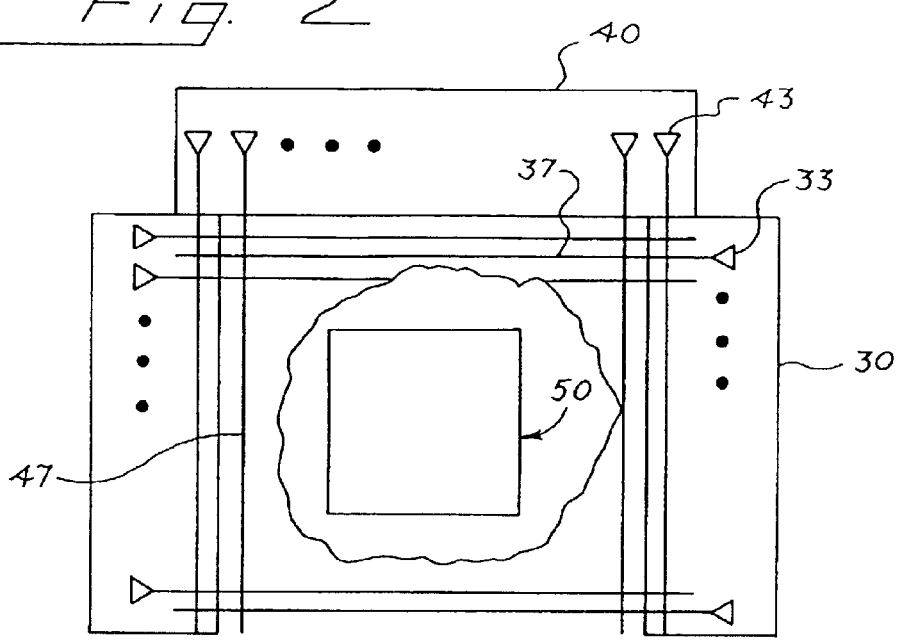
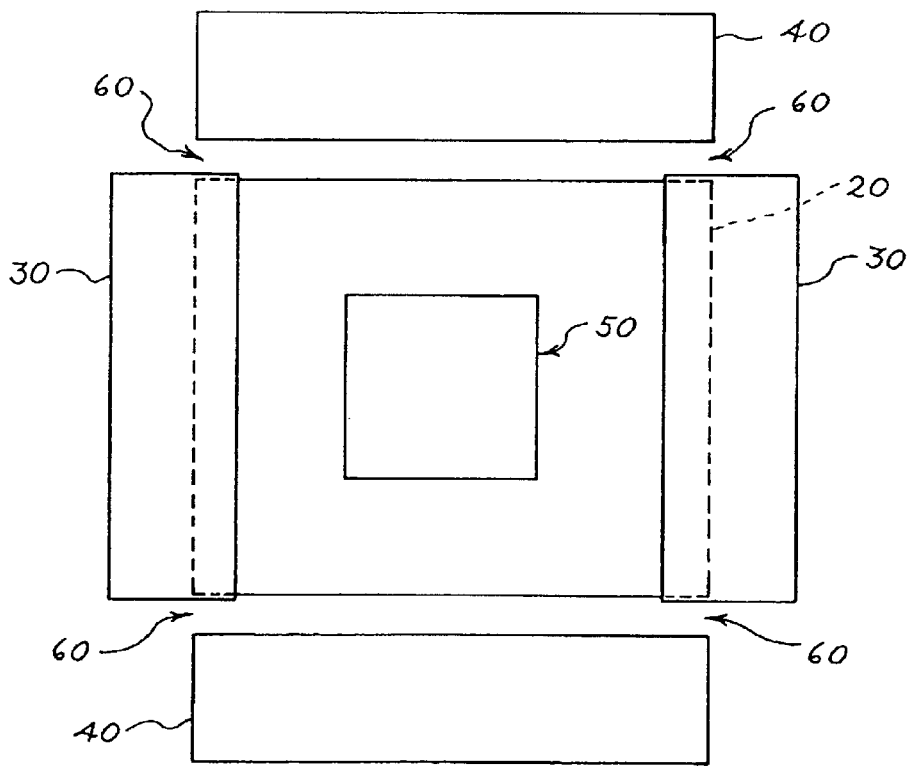

INTEGRATED SYSTEMS USING VERTICALLY-STACKED THREE-DIMENSIONAL MEMORY CELLS

RELATED APPLICATIONS

This application claims the benefit of U.S. Provisional Application No. 60/308,330 filed Jul. 26, 2001, which is incorporated by reference herein. Additionally, this application is a continuation-in-part of U.S. patent application Ser. No. 09/638,334, filed Aug. 14, 2000, now U.S. Pat. No. 6,545,891, which is also incorporated by reference herein.

BACKGROUND

A three-dimensional memory array has a plurality of layers of memory cells stacked vertically above one another and above a single substrate of an integrated circuit. U.S. Pat. No. 6,034,882 to Johnson et al., which is assigned to the assignee of the present invention, describes one such three-dimensional memory array. Support circuitry for the three-dimensional memory array can be formed in the substrate at least partially under the three-dimensional memory array. Although there are many advantages associated with three-dimensional memory arrays, improvements that allow a three-dimensional memory array to be used in a variety of applications are desired.

SUMMARY

The present invention is defined by the following claims, and nothing in this section should be taken as a limitation on those claims.

By way of introduction, the preferred embodiments described below relate to a monolithic integrated circuit comprising a three-dimensional memory array having a plurality of layers of memory cells stacked vertically above one another and above the substrate of the integrated circuit. Support circuitry for the three-dimensional memory array is formed in the substrate at least partially under the three-dimensional memory array and defines open area in the substrate under the three-dimensional memory array. In one preferred embodiment, one or more memory arrays are formed at least partially in the open area under the three-dimensional memory array, while in another preferred embodiment, logic circuitry implementing one or more functions is formed at least partially in the open area under the three-dimensional memory array. In yet another preferred embodiment, both one or more memory arrays and logic circuitry are formed at least partially in the open area under the three-dimensional memory array. Other preferred embodiments are provided, and each of the preferred embodiments can be used alone or in combination with one another.

The preferred embodiments will now be described with reference to the attached drawings.

BRIEF DESCRIPTION OF THE DRAWINGS

FIG. 2 is an illustration of an integrated circuit of a preferred embodiment in which x-line drivers for a three-dimensional memory array are on opposite sides of a second memory array, while y-line drivers are on only one side of the second memory array.

FIG. 3 is an illustration of an integrated circuit of a preferred embodiment in which there are gaps in the corners of the support circuitry.

DETAILED DESCRIPTION OF THE PRESENTLY PREFERRED EMBODIMENTS

Introduction

Figure 1A:
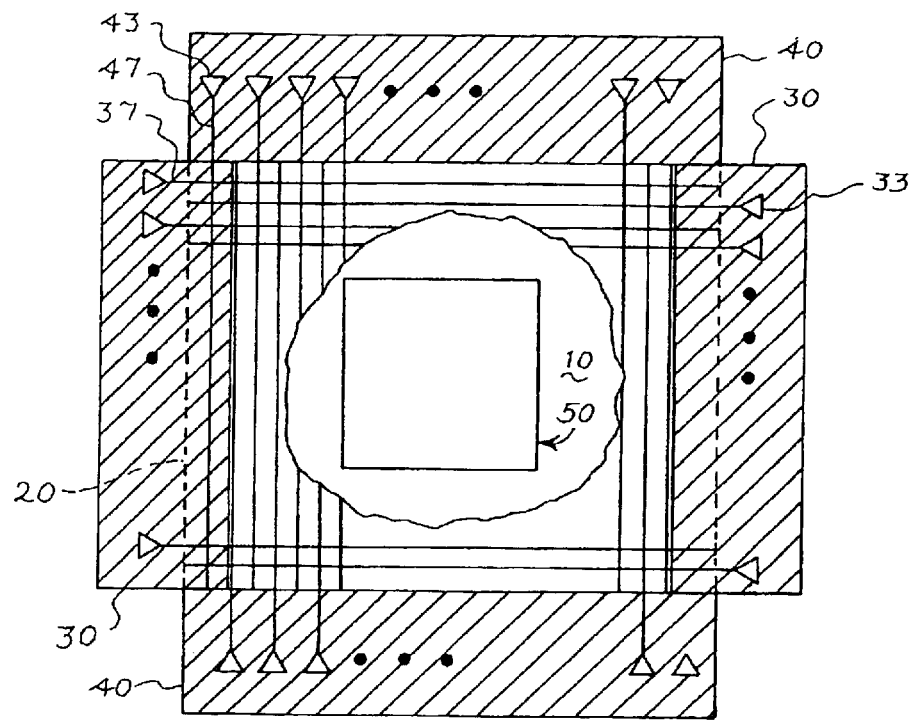
FIG. 1A is an illustration of an integrated circuit of a preferred embodiment.

The preferred embodiments described below relate to an integrated circuit comprising a three-dimensional memory array having a plurality of layers of memory cells stacked vertically above one another and above the substrate of the integrated circuit. Examples of such three-dimensional memory arrays can be found in U.S. Pat. No. 6,034,882 to Johnson et al. and U.S. patent application Ser. No. 09/560,626, both of which are assigned to the assignee of the present invention and are hereby incorporated by reference. It should be noted that some prior memory arrays have cells that protrude either upwardly or downwardly. While these cells have, in the past, been referred to as a "three dimensional memory cell," these memory cells are arrayed in a conventional two-dimensional array and are not stacked vertically above one another and above a single substrate of an integrated circuit. Accordingly, an array of such cells is not a "three-dimensional memory array," as that term is used herein. Further, individual integrated circuits each containing a separate two-dimensional memory array can be stacked and secured together. However, the overall three-dimensional structure is not a monolithic "three-dimensional memory array" because the memory cells of the stack are not stacked above a single substrate and the memory cells are not stacked vertically above one another (because there is an interposing substrate between each layer).

As mentioned above, the layers of memory cells of a three-dimensional memory array are stacked vertically above one another and above a substrate of an integrated circuit. Support circuitry for the three-dimensional memory array is formed in the substrate at least partially under the three-dimensional memory array. As used herein, the term "support circuitry" refers to circuitry used in writing to and/or reading from memory cells in the three-dimensional memory array. Examples of support circuitry include, but are not limited to, memory line drivers, row and column decoders, sense amplifiers, write circuits, charge pumps, column I/O circuitry, and circuitry used to choose which memory cell to write in/read from.

Because of the nature of a three-dimensional memory array, a relatively small area of the substrate is needed for support circuitry. In these preferred embodiments, the open area in the substrate defined by the support circuitry is used to form one or more additional memory arrays and/or logic circuitry. In this way, one or more additional memory arrays and/or logic circuitry can be formed at least partially under the three-dimensional memory array in the substrate. Exploiting the relatively large areas of unused silicon substrate to place devices (such as standard CMOS transistors) in the substrate under stacked memory cells (such as non-volatile thin film transistor memory elements) on one chip allows for many different types of integrated systems to be derived.

The following section discusses several suitable layouts for the three-dimensional memory array, additional memory array(s), and logic circuitry. After that discussion, several applications that can be used with these integrated systems will be described, followed by a discussion of devices and memory cells that can be used with these preferred embodiments.

Layouts

Generally, it is desired to have large fan out on the memory lines because the number of drivers and decoders for the memory lines decreases for an equal number of memory cells when the fan out increases. For a three-dimensional memory array with a large fan out on the memory lines, the space in the substrate under the three-dimensional memory array is large. However, much of this space is used by very densely-packed support circuits for the three-dimensional memory array. The layouts described below create a larger space under the three-dimensional memory array. One or more memory arrays and/or logic circuitry can be placed in this space, and wire connections to the memory array(s) and/or logic circuitry can pass through the support circuitry of the three-dimensional memory array.

Turning now to the drawings, FIG. 1A is an illustration of an integrated circuit of a preferred embodiment. This integrated circuit comprises a substrate 10, a three-dimensional memory array 20 (shown in outline) comprising a plurality of layers of memory cells stacked vertically above one another and above the substrate 10, and support circuitry 30, 40 for the three-dimensional memory array 20. The support circuitry 30, 40 is formed at least partially under the three-dimensional memory array 20 in the substrate 10. In this embodiment, the three-dimensional memory array 20 does not overlap all of the support circuitry 30, 40. Specifically, drivers 33, 43 that drive word (or x-memory) lines 37 and bit (or y-memory) lines 47, respectively, in the three-dimensional memory array 20 are not under the three-dimensional memory array 20. By being outside the "shadow" of the three-dimensional memory array 20, the drivers 33, 43 can connect to the upper levels of memory cells in the memory array 20. Additionally, positioning the drivers 33, 43 outside the shadow of the three-dimensional memory array 20 allows the drivers 33, 43 to be at the end of the memory lines 37, 47, which is more efficient than having the drivers 33, 43 in the middle of the memory lines 37, 47, as would occur if the drivers 33, 43 were positioned under the three-dimensional memory array 20. Additional support circuitry (such as decoders) under the three-dimensional memory array 20 is not shown in FIG. 1A to simplify the drawing.

Figure 1B:
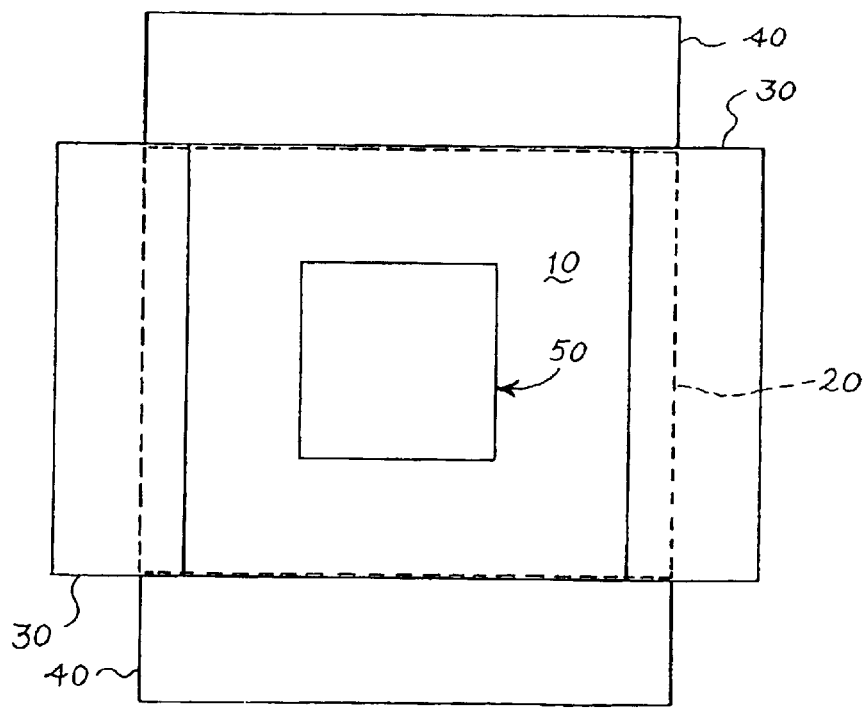
FIG. 1B is an illustration of the integrated circuit of FIG. 1A with the word lines, bit lines, and drivers removed.

The support circuitry 30, 40 defines open area in the substrate 10 under the three-dimensional memory array 20, and, in this preferred embodiment, a second memory array 50 is formed at least partially in that open area. In FIG. 1A, the word and bit lines 37, 47 above the second memory array 50 have been removed so that the second memory array 50 can be seen. In FIG. 1B, the word and bit lines 37, 47 as well as the drivers 33, 43 have been removed to more clearly illustrate the second memory array 50. In FIGS. 1A and 1B, the second memory array 50 is one continuous piece of memory between the support circuitry 30, 40 of the three-dimensional memory array 20. This allows the support circuitry 30, 40 to get as close to the edges of the three-dimensional memory array 20 as possible. As will be described below, the second memory array can alternatively be divided into two or more pieces of memory.

As shown in FIG. 1A, the support circuitry 30, 40 is on all four sides of the second memory array 50, with support circuitry 30 driving word lines 37 for the three-dimensional memory array 20 from alternating left and right drivers 33, and support circuitry 40 driving bit lines 47 for the three-dimensional memory array 20 from alternating top and bottom drivers 43. If the memory cells of the three-dimensional memory array 20 have a small cell size, twice as much pitch can be required if the drivers 33, 43 are along a single edge of the second memory array 50. Accordingly, interleaving the word and bit lines 37, 47 and driving them from two sides provides the most dense layout of the three-dimensional memory array 50. Instead of completely surrounding the second memory array 50 on all four sides, the support circuitry 30, 40 can partially surround the second memory array 50, as shown in FIG. 2. In FIG. 2, word-line drivers 33 are on opposite sides of the second memory array 50, as in FIG. 1A, but the bit-line drivers 43 are on only one side of the second memory array 50. Accordingly, only the word lines 47 are interleaved. (In an alternate embodiment, the bit-line drivers 43 are on both sides of the second memory array 50, and the word-line drivers 33 are on only one side.) This arrangement is suitable for less dense three-dimensional memory arrays with bigger memory cells where interleaving is not as important.

In the preferred embodiment shown in FIGS. 1A and 1B, the second memory array 50 was completely surrounded by the support circuitry 30, 40 for the three-dimensional memory array 20. In that preferred embodiment, wire connections to the second memory array 50 pass through the support circuitry 30, 40 for the three-dimensional memory array 20. The wire connection can communicate signals (such as, but not limited to, address information, data, control signals (e.g., chip select), and timing pulses to enable real/write operations) between the second memory array and interface logic or pads that connect to an external component. If the support circuitry 30, 40 does not completely surround the second memory array 50, as in the arrangement shown in FIG. 2, wire connections through the three-dimensional support circuits 30, 40 would be optional, as the wire connections can run through the "open" side of the second memory array 50. FIG. 3 shows another preferred embodiment in which the second memory array 50 is only partially surrounded by the support circuitry 30, 40. Here, the second memory array 50 is still between the support circuitry 30, 40, but the support circuitry 30, 40 has gaps 60 in the corners. The gaps 60 can be used for spacing of CMOS circuit regions called wells or to pass wire connections to the second memory array 50.

Figure 4:
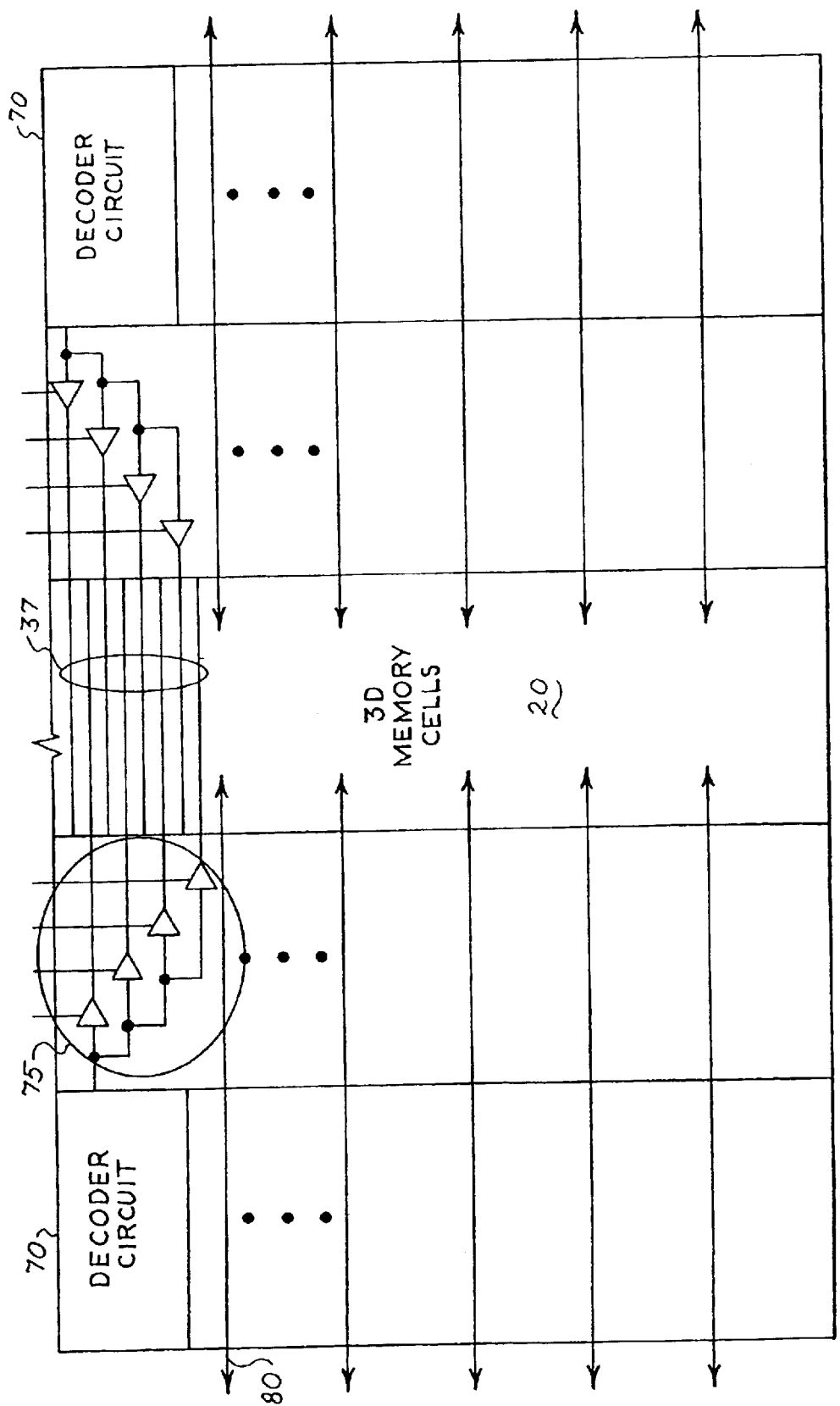
FIG. 4 is an illustration of a multi-headed driver decode circuit of a preferred embodiment.

As described above, wire connections to the second memory array 50 can pass through the support circuitry of the three-dimensional memory array 20. To increase the room in the support circuitry through which wire connections 80 can pass and to provide more efficient support circuitry, a multi-headed driver decode circuit 70 with a simple memory line driver can be used, as shown in FIG. 4. While a set of four drivers 75 are shown for illustration purposes in FIG. 4, it is preferred that 16 or more drivers per multi-headed driver decode circuit 70 be used. As also shown in FIG. 4, the memory lines 37 are interleaved so that the drivers and memory line connections are less dense on each side. A suitable multi-headed driver decode circuit is described in U.S. patent application Ser. No. 09/896,814, which is assigned to the assignee of the present invention and is hereby incorporated by reference.

Figure 5:
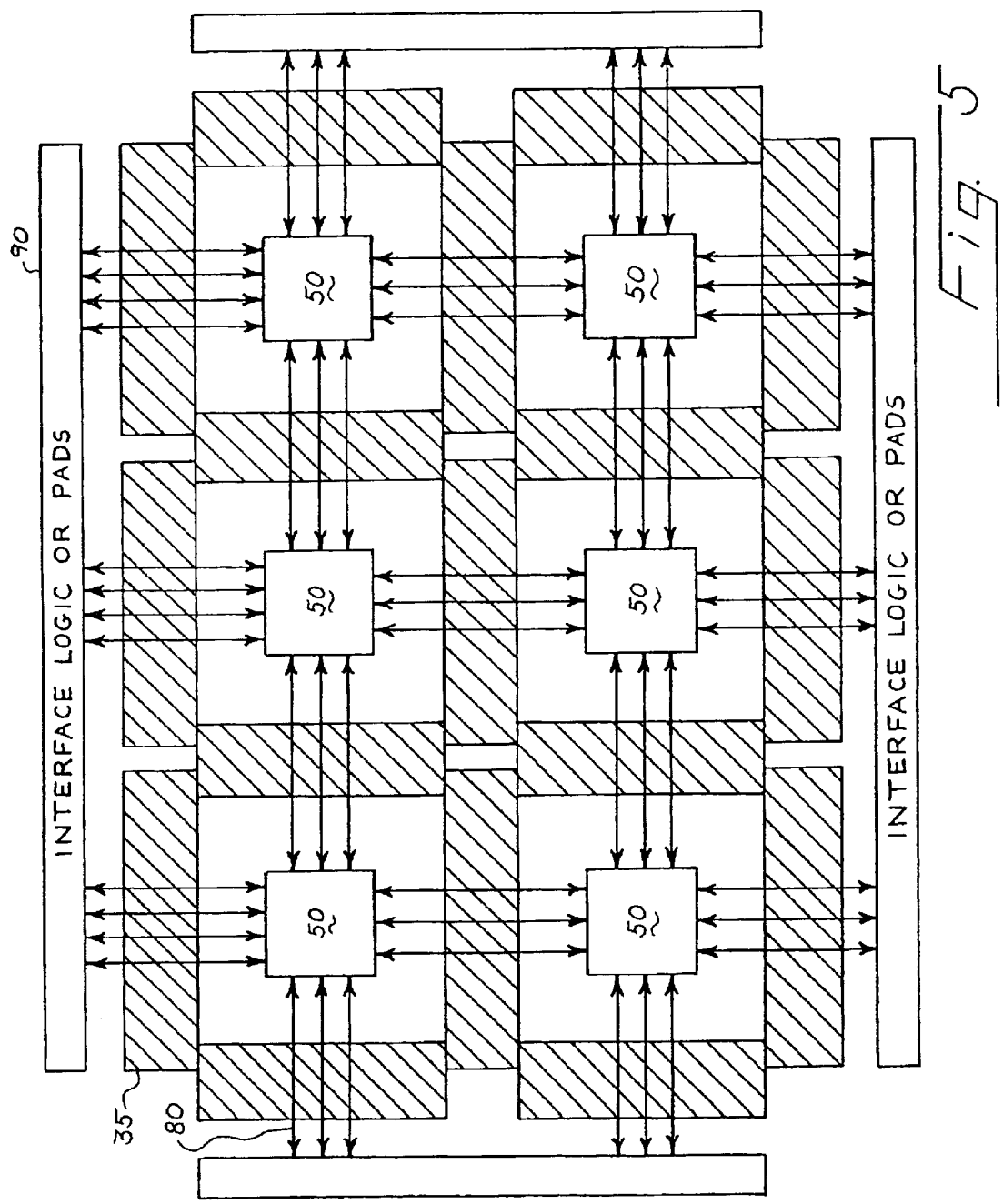
FIG. 5 is an illustration of an integrated circuit of a preferred embodiment in which a second memory array is divided into multiple pieces and located in multiple regions between support circuitry in a substrate.

In the preferred embodiments described so far, the second memory array 50 has been one continuous piece of memory. As mentioned above, the second memory array can alternatively be divided into two or more pieces of memory located in multiple regions between the support circuitry. This alternative is shown in FIG. 5. Here, the second memory array 50 is split into six parts that function as a whole and are preferably accessed in parallel. Alternatively, the multiple parts of the second memory array can be partitioned into banks that are accessed in parallel so that two different operations (e.g., write and read) can be simultaneously performed on two different parts of the second memory array. Each part of the second memory array has wire connections 80 passing through the support circuitry 35 of the three-dimensional memory array. The wire connections 80 also connect to interface logic or pads 90, which is the I/O circuit that is used to communicate data, address, and control information between an external component (e.g., a CPU) and the second and three-dimensional memory arrays. Preferably, the multi-headed driver decode circuit 70 shown in FIG. 4 is used to provide room for the wire connections 80 to pass through the support circuitry 35 to the multiple parts of the second memory array 50.

Figure 6:
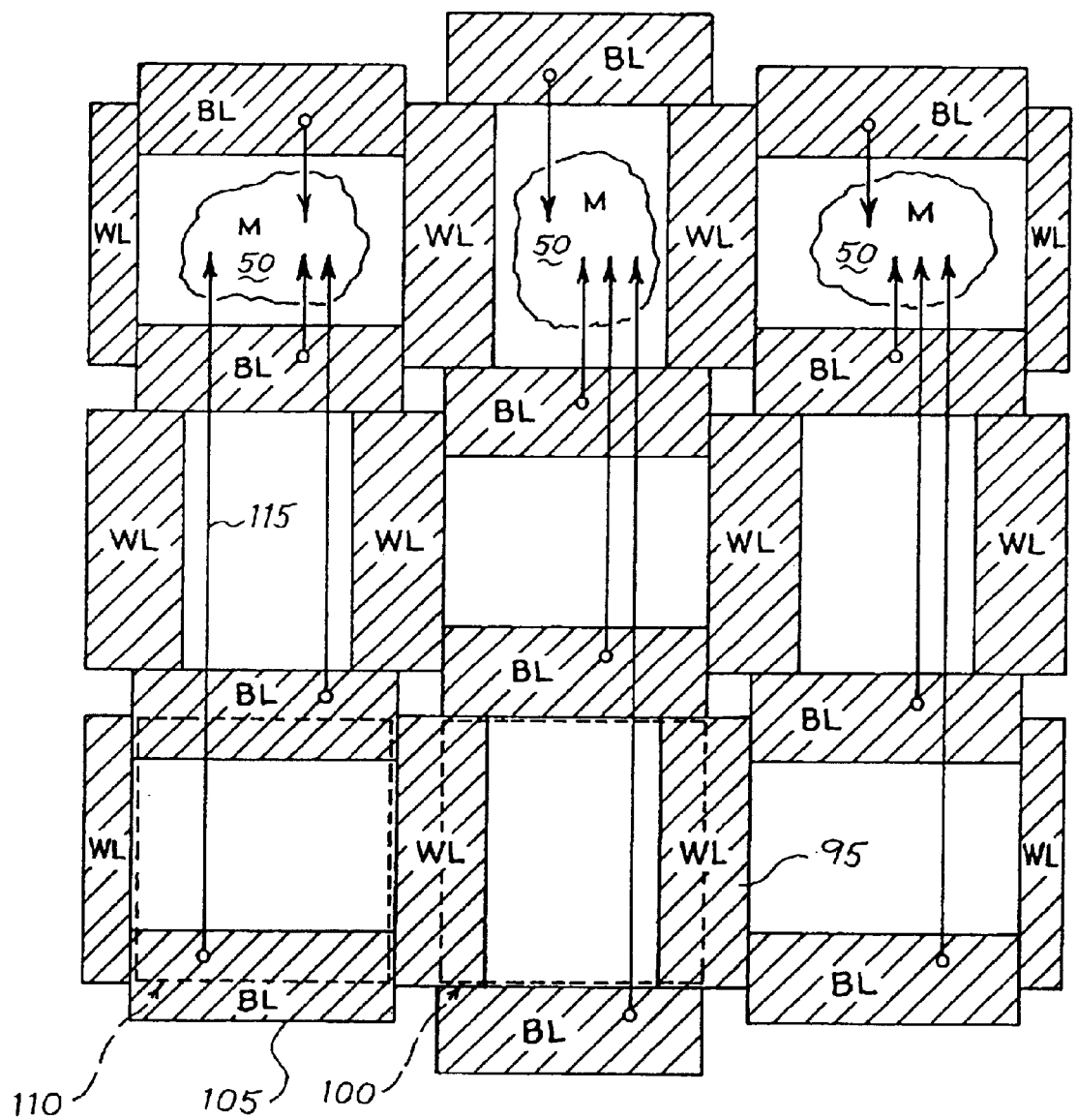
FIG. 6 is an illustration of an integrated circuit in which row and column decoder circuitry is arranged in a checkerboard pattern under sub-arrays of a three-dimensional memory array.

In another preferred embodiment, the three-dimensional memory array is organized in a plurality of sub-arrays to increase operating speed (because conductors are shorter and there are fewer memory cells attached to each conductor) and lower operating power (by decreasing conductor capacitance). Preferably, the row and column decoder circuitry is arranged in a checkerboard pattern under the sub-arrays, as described in U.S. patent application Ser. No. 09/896,814, which is assigned to the assignee of the present invention and is hereby incorporated by reference. When arranged in a checkerboard pattern, a row or column decoder circuit is associated with a sub-array above its location and an adjacent sub-array. As shown in FIG. 6, with this arrangement, there are two types of sub-arrays in the three-dimensional memory array: one in which word line support circuitry 95 is partially under the sub-array 100 and another in which bit line support circuitry 105 is partially under the sub-array 110. Here, there are four of the first type of sub-array 100 and five of the second type of sub-array 110. The open areas under the two types of sub-arrays 100, 110 are different because the word line support circuitry 95 and bit line support circuitry 105 define different open shapes in the substrate.

When the checkerboard arrangement of support circuitry is used, it is preferred that the second memory array be divided into two or more pieces and located in multiple regions between the support circuitry. Although any suitable division and arrangement can be used, in the embodiment shown in FIG. 6, the second memory array 50 is divided into three pieces, one in each column of sub-arrays. Additionally, in this embodiment, each piece of the second memory array 50 has data lines connecting it to all the bit-line-type sub-arrays 110 in a column, thereby allowing data can be exchanged between the second memory array 50 and the three-dimensional memory array. In this embodiment, the number of pieces of the second memory array 50 is minimized while the partial selection of a horizontal stripe of sub-arrays saves power while providing a high data rate by supplying data to all the pieces of the second memory array 50.

Figure 7:
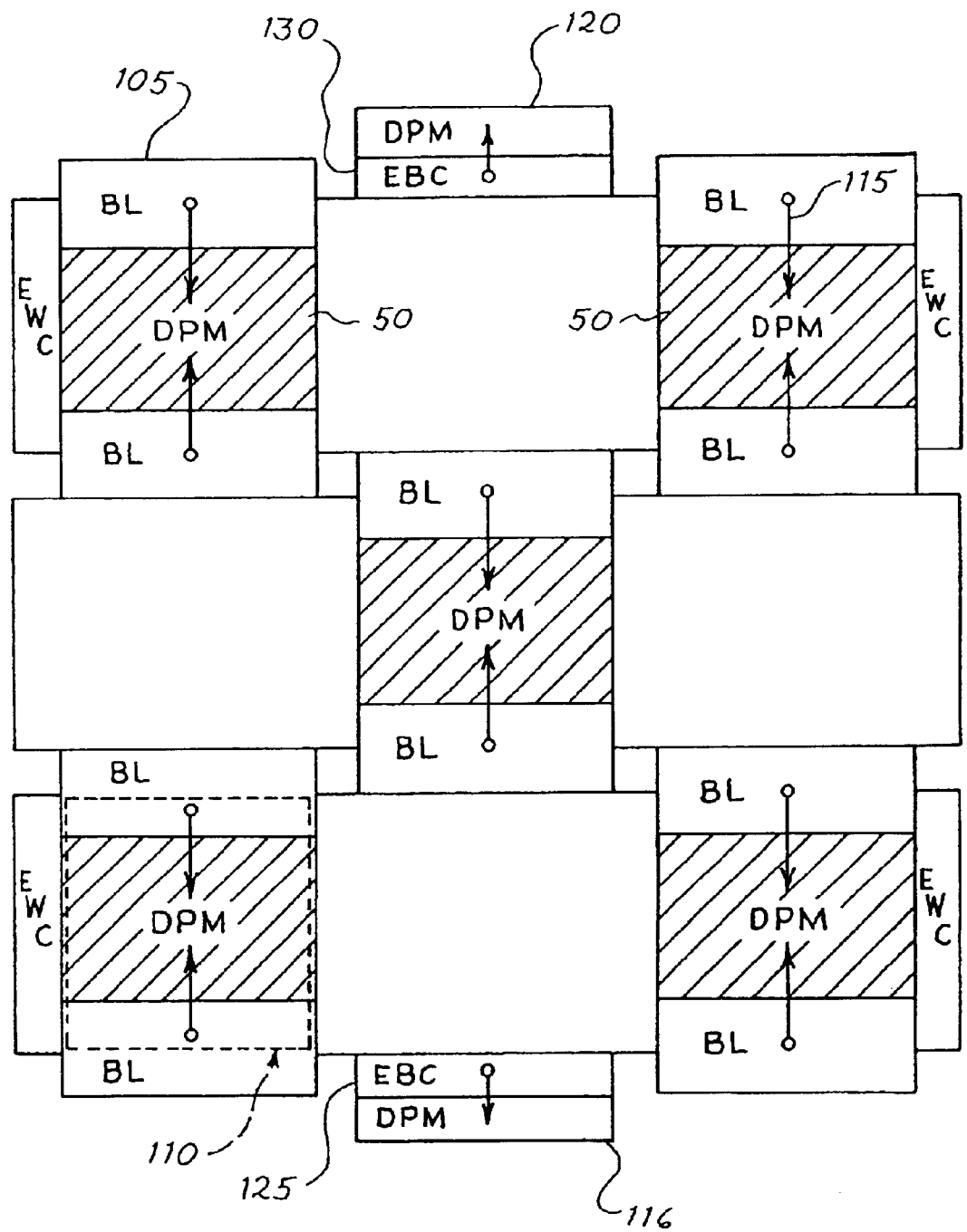
FIG. 7 is an illustration of a preferred embodiment in which sub-arrays of a three-dimensional memory array overlie a distributed page memory (DPM) in a substrate.

In the embodiment shown in FIG. 7, row and column decoder circuitry is arranged in a checkerboard pattern under the sub-arrays of the three-dimensional memory array, and the second memory array 50 is a distributed page memory (DPM) or cache memory. The second memory array 50 is divided into seven parts and placed under all the bit-line-type sub-arrays 110. The second memory array 50 has data line connections 115 to the associated bit-line circuitry 105 between which it is placed. This has the advantage of very short connections between the three-dimensional memory array and the distributed page memory 120. A larger number of data line connections between the three-dimensional memory sub-arrays and the second memory sub-arrays are possible with small area, and a high data rate can be achieved. In this embodiment, two parts of the distributed page memory 116, 120 are not located under the three-dimensional memory array. The data lines to these parts 116, 120 run through edge bit line circuitry 125, 130 at the edges of the second column.

Figure 8:
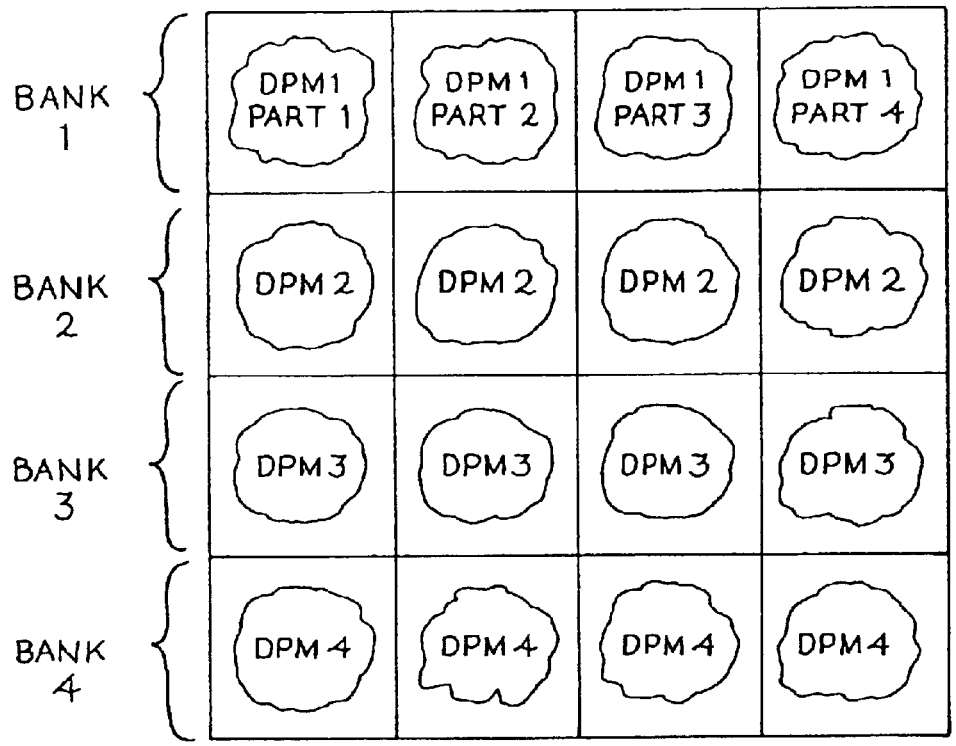
FIG. 8 is an illustration of a multi-bank three-dimensional memory array with multi-bank cache memories of a preferred embodiment.

The distributed page memory can also be arranged in a multi-bank fashion, as shown in FIG. 8. In that embodiment, four banks (DPM 1–4) of distributed page memory are provided, with the memory in each bank divided into four parts. The three-dimensional memory array is divided into 16 sub-arrays, which are also arranged in a multi-bank fashion. This provides higher data throughput by transferring data from several three-dimensional memory sub-arrays in a given bank to its cache memory while other banks are transferring data from the cache memory to the chip input or output port. This is more space efficient than other caching proposals, such as the one described in ISSCC 2002 paper 6.4 where the cache memory circuits are not located under the nonvolatile memory array.

Figure 9:
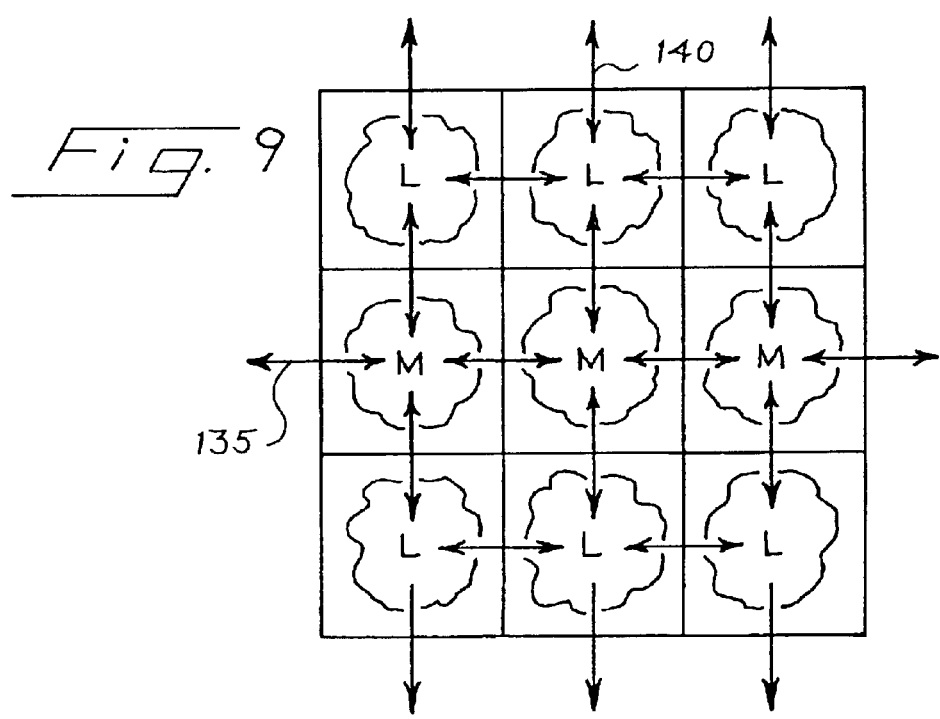
FIG. 9 is an illustration of a preferred embodiment in which a second memory array is formed in a substrate in some of the regions between support circuitry of a three-dimensional memory array and logic circuitry is formed in other regions.

As mentioned above, instead of or in addition to a second memory array, logic circuitry can be formed in the open area in the substrate defined by the support circuitry for the three-dimensional memory array. Logic circuitry can be designed to provide any desired functionality. Examples of such functionality are described in the Applications section below. While logic circuitry can be split into multiple parts and arranged between the support circuits (like the second memory array 50 in FIG. 5), it may be preferred to avoid splitting up the logic circuitry. Additionally, it may be preferred to avoid passing the logic lines of the logic circuitry through the support circuitry for the three-dimensional memory array. For example, as shown in FIG. 9, logic circuitry (L) and parts of a second memory array (M) can be arranged such that the parts of the second memory array M are between support circuitry for one or more three-dimensional memory sub-arrays. While the logic circuitry L has wiring 140 to its divided parts and to the parts of the second memory array M, the logic circuitry L in this embodiment does not pass through the support circuitry of the three-dimensional memory array. The second memory array M does have wiring 135 through the support circuits to the outside interface, as well as to the other parts of the second memory array M. Further, the second memory array M can have a wide interface to the three-dimensional memory by forming multiple data connections to multiple sub arrays.

Figure 10:
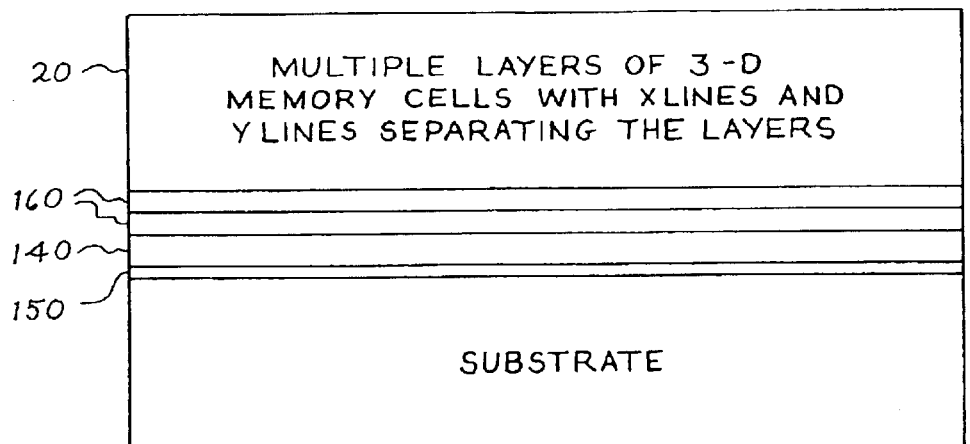
FIG. 10 is an illustration of a preferred embodiment showing that support circuitry for a three-dimensional memory array can be built in silicon-on-insulator (SOI) material.

Finally, as described above, the support circuitry for the three-dimensional memory array is formed in the substrate. It should be noted that the phrase "formed in the substrate" should be interpreted as formed in or formed on the substrate. For example, in addition to being formed in the actual substrate, the support circuitry can also be built in silicon-on-insulator (SOD material, which is the device layer 140 formed on the substrate 10 but electrically isolated from the substrate 10 by a thin isolating layer 150, by techniques including oxygen implantation or etching to form porous silicon (see FIG. 10). The support circuitry would be in the one or more layers 160 for SOI devices. Such SOI devices can have the advantages of lower parasitic capacitance or leakage that benefit the support circuitry and the second memory array built in/on the substrate 10. Such SOI devices are, therefore, an alternate method of forming the layer of circuitry on the substrate. The SOI devices or, alternatively, bulk CMOS devices both need wiring connections between the devices, which take about ten masks to build. A layer of memory cells above the substrate 10 is built with one or two mask steps per layer. The efficiency derives from having multiple layers of memory cells but only one complex layer of support circuitry, where all the available area in the complex first layer is used.

Applications

The preceding section discussed various layouts of a three-dimensional memory array with a second memory array and/or control logic in the substrate under the three-dimensional memory array. This section discusses several application that can be used with those integrated systems.

In one application, the second memory array in the substrate is used as a cache memory for the three-dimensional memory array above the substrate. The three-dimensional memory array can be a relatively slow memory, and providing a cache memory allows for faster reads and writes. For example, the second memory array can be configured as an SRAM buffer used as a cache memory for faster access to subsets of data stored in the larger three-dimensional memory array above it. The cost of SRAM has limited its use up to now to relatively small densities. The combination of SRAM and the three-dimensional memory array would give a higher "virtual density" for the SRAM in applications such as 3G cellular phones. Further, an integrated cache and three-dimensional memory array provide additional advantages over prior two-dimensional caching topologies. For example, die cost is reduced because the three-dimensional memory array sits above the cache memory array and, hence, saves area. Additionally, the bus structure between the cache memory array and the three-dimensional memory array can be wide and short because of the relative proximity of the memory arrays. This saves cost (because of the area savings) and power (because of the small drivers needed for short distances) as compared to prior two-dimensional integrated systems, which have long busses and large die sizes. Further, chip power is reduced because of the higher degree of integration. Finally, the cells of both memory arrays can be pitch-matched and stacked directly above one another, allowing common sensing and decoding circuitry to be used for both types of cells. This saves cost (because of the area savings) and power (because half as many driver circuits are used).

Figure 11:
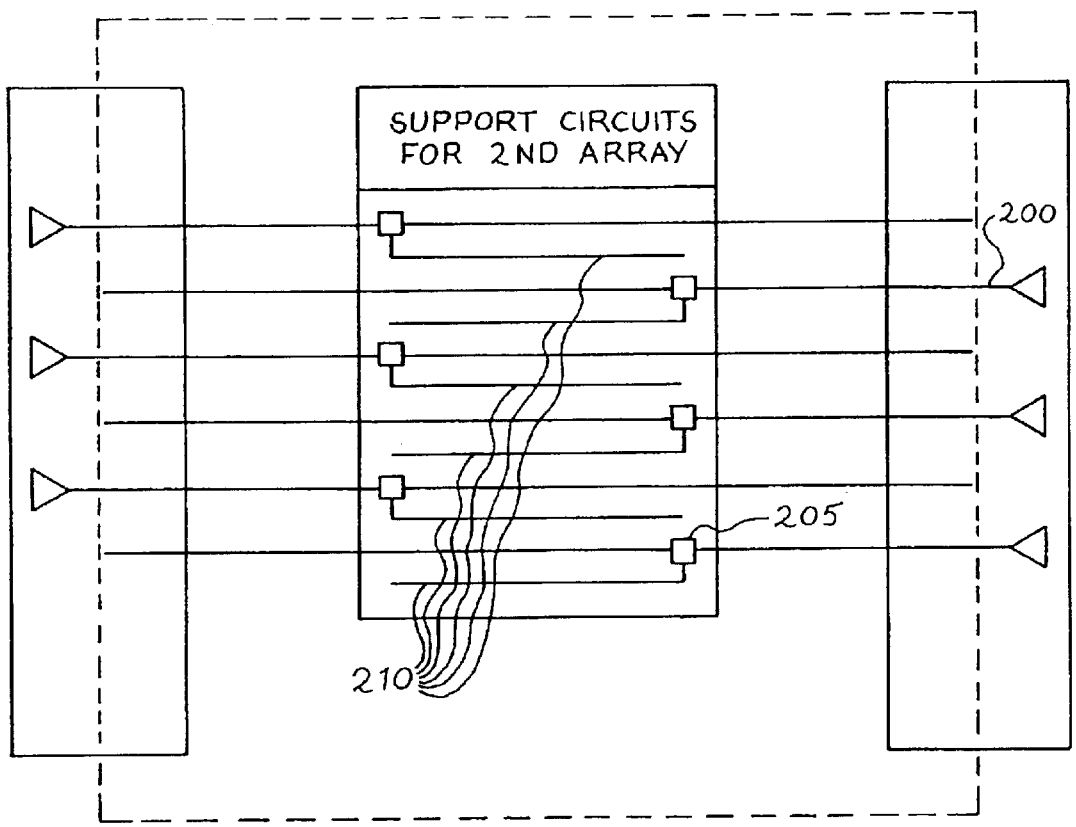
FIG. 11 is an illustration of a preferred embodiment in which array lines are shared between a three-dimensional memory array and a second memory array in a substrate.

In another preferred embodiment (shown in FIG. 11), the support circuits for the two types of memory are shared to save space. FIG. 11 depicts three-dimensional memory array supports connected to the lowest layer of three-dimensional memory array lines. The other layers of three-dimensional memory array lines are not shown. The lowest layer of three-dimensional memory array lines can be connected to what is below. In this case, the lines 200 are connected to the memory lines 210 of the second memory type built on the substrate via a connector 205. Decoder and other support circuits needed to support those memory array lines are avoided, thereby saving space. The second memory can have a larger cell size than the three-dimensional memory and use only some of the memory lines. The shared line can be the word line for the three-dimensional memory and the word line for the second memory, or serve as the bit line for both.

In a preferred embodiment, there are EEPROM cells on the substrate underneath the three-dimensional array. The three-dimensional memory structure is of the type disclosed in U.S. patent application Ser. No. 10/180,046, which is assigned to the assignee of the present invention and is hereby incorporated by reference. The memory lines serve as word lines for a lower layer of three-dimensional memory cells and serve as bit lines for an upper layer of three-dimensional memory cells. In this embodiment, the lowest three-dimensional memory array lines connect to word lines of the EEPROM memory built on the substrate and also serve as the bit lines of the first layer of three-dimensional non-volatile memory.

Figure 12:
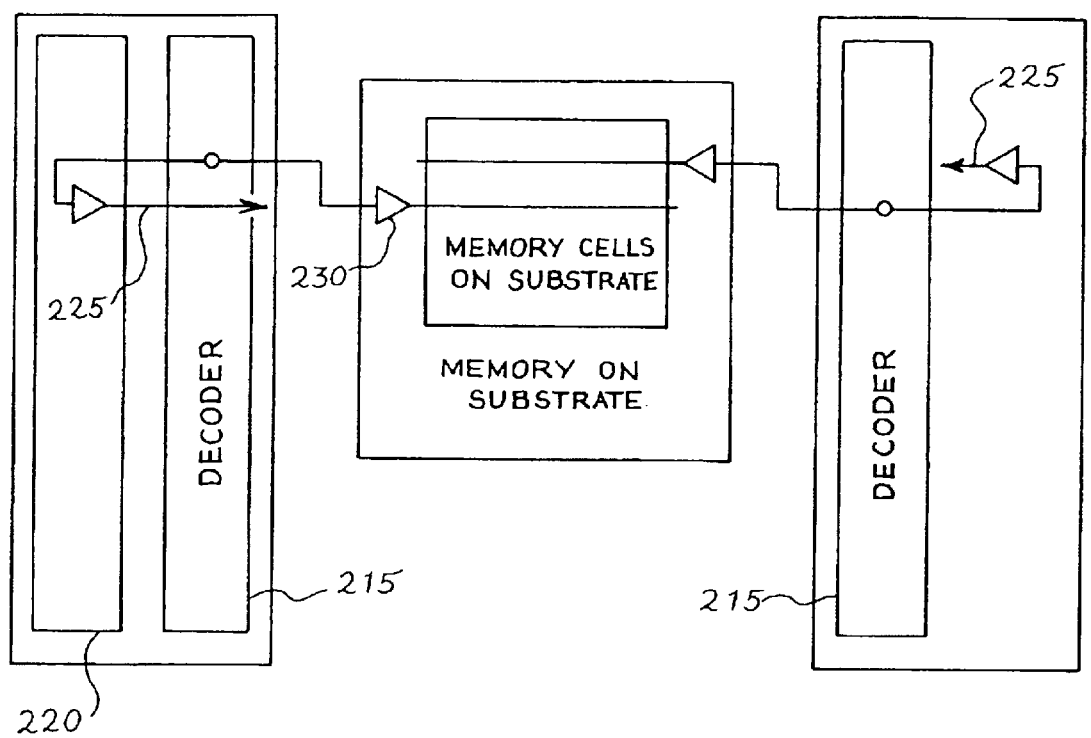
FIG. 12 is an illustration of a preferred embodiment in which decoder outputs are used by a three-dimensional memory array and a second memory array in a substrate.

In an alternate embodiment, the output lines from the decoder 215 are shared rather than connecting memory lines together. This alternate embodiment is shown in FIG. 12. The decoder 215 output is connected to three-dimensional memory line drivers 220 (which connect to three-dimensional memory array lines 225) at the edge of the three-dimensional memory array and to second memory array lines drivers 230 under the three-dimensional memory.

In another caching application, both the second memory array and the three-dimensional memory array can be used in a disk drive controller system, where there is a large time penalty in waiting for the drive interface to be ready to receive data. By using the integrated memory system of this preferred embodiment, the second memory array can be used as a first level of cache, and the three-dimensional memory array can be used as a second level of cache for the mechanical disk drive. The increased capacity of the combined second memory array and three-dimensional memory array allows for larger and less frequent transfers to the disk drive, improving system performance. These and other caching operations involving a three-dimensional memory array are described in more detail in U.S. patent application Ser. No. 10/186,356, which is assigned to the assignee of the present invention and is hereby incorporated by reference herein.

In caching applications, the second memory array is typically made up of volatile memory cells. In another application, both the three-dimensional memory array and the second memory array comprise non-volatile memory cells. For example, the second memory array can comprise CMOS transistors configured as EEPROM cells, with a pitch matching that of the memory cells (e.g., EEPROM memory cells) stacked above them in the three-dimensional memory array. Common addressing and sense-amp circuits can be used for both types of cells. The CMOS EEPROM cells would be faster than the cells on the upper layers, making them suitable for a NOR configuration Flash memory, while the upper layers can be configured as a NAND Flash memory. Such a combination of NOR/NAND memory can be used in cellular phones where the smaller NOR memory is used for code storage and the larger NAND memory is used for data storage. The faster access time of the NOR memory suits the fast, random nature of code accesses, while the larger capacity of the NAND memory suits the nature of data such as digital images or songs.

There are also several applications that can be used with logic circuitry placed in the open area under the substrate. For example, the logic circuitry can be configured as host device interface circuitry, making the memory array compatible with standard or proprietary architectures. Host device interface circuitry includes all of the components needed to create the voltages, clock frequencies, and protocol logic that allow a modular memory device comprising the three-dimensional memory array to attach to a variety of consumer host devices. In one implementation, the host device interface circuitry uses any suitable combination of hardware, software, and firmware to implement the task file, interrupt management, error reporting, and configuration functions included in the protocol being used (e.g., CompactFlash, MultiMediaCard, Secure Digital (SD), or Sony Memory Stick). If space allows, more than one host device interface circuitry can be implemented, allowing one chip to serve as a memory card in different formats. This gives the manufacturer of the chip increased flexibility in controlling inventory. U.S. patent application Ser. No. 09/638,334, which is assigned to the assignee of the present invention and is incorporated by reference, provides further discussion of host device interface circuitry and three-dimensional memory arrays.

The logic circuitry in the substrate under the three-dimensional memory array can also be configured as control circuitry for an ISA interface to allow the three-dimensional memory array to behave like a disk drive. The higher level of integration would provide cost savings to system designers. In another application, the logic circuitry is configured as an audio decoder, allowing the whole chip to be a secure player of music data put into the three-dimensional memory array. The analog output of the audio decoder can be fed directly to a loudspeaker. Because it does not output digital data, this integrated system prevents digital data stored in it from being copied or intercepted.

As mentioned above, the integrated system can contain both logic circuitry and a second memory array in the substrate. One application of such an integrated system would be to configure the logic circuitry as a microprocessor, use the three-dimensional memory array for code storage, and use the second memory array as an integrated cache. In this way, the whole chip would be an integrated system with field-programmable memory (i.e., a field-programmable microprocessor). Such chips can be upgraded in the field, allowing greater flexibility and lower costs for manufacturers of systems using such a processor.

Devices and Memory Cells

The integrated circuit with the three-dimensional memory array and second memory array/logic circuitry can be used in any suitable device. In one preferred embodiment, the integrated circuit is part of a modular memory device (such as a memory card or stick) that is removably connectable to a host device having a mating connection. The host device comprises a processing unit that reads data from/writes data to the memory array(s) in the integrated circuit. A host device can be, for example, a portable consumer electronic device such as a cell phone, a music player, a personal digital assistant, or a digital camera. Instead of being removable from a host device, the integrated circuit can be part of a device that comprises a processing unit. For example, the integrated circuit can be a permanent part of a cell phone.

It should be noted that any suitable type of memory cell can be used in the three-dimensional memory array and the memory array(s) in the substrate. For example, a write-once, write-many, volatile, non-volatile, field programmable, or non-field programmable memory cell can be used in either the three-dimensional memory array or in the memory array(s) in the substrate. Further, the memory cell used in the three-dimensional memory array can be different from that used in the memory array(s) in the substrate. For example, the three-dimensional memory array can be made of non-volatile memory cells, while the memory array(s) in the substrate can be made of volatile memory cells. Volatile memory cells can take any suitable form, including, but not limited to, SRAM cells and DRAM cells. Suitable non-volatile memory cells include, but are not limited to, Flash cells, junction anti-fuse memory cells, and pillar anti-fuse memory cells, as well as EEPROM three-dimensional memory cells using SONOS or floating-gate cells. U.S. Pat. No. 6,034,882 to Johnson et al. and U.S. patent application Ser. Nos. 09/560,626 and 09/927,648, all of which are assigned to the assignee of the present invention and are hereby incorporated by reference, provide further detail on the construction of memory arrays using these types of memory cells. Additionally, while the memory cells are preferably made from a semiconductor material, other materials, such as phase-change materials and amorphous solids as well as those used with MRAM and organic passive element arrays, can be used.

It should also be noted that the memory array(s) in the substrate and the three-dimensional memory array can each be built with multiple types of memory cells. There is no limit to the number of memory types that can be used in each memory array, and a plurality of memory types can be used per die to resolve different memory requirements. For example, both field-programmable write-once and field-programmable re-writable memory cells can be used in the three-dimensional memory array, as described in "Multiple-Mode Memory and Method for Forming Same," U.S. patent application Ser. No. 10/184,578, which is assigned to the assignee of the present invention and is hereby incorporated by reference. As another example, one die can contain two completely separate three-dimensional write-once cells, one cell programmed during manufacturing for register settings used by a controller and another updateable in the field to store data, such as a digital media file (e.g., pictures, songs). Additionally, the same die can contain multiple re-writeable memory cells (e.g., Flash, three-dimensional memory, DRAM, SRAM) to store file system structures (such as a FAT table, root directory, or sub-directory) or data with different speed or access time requirements (e.g., the write and/or read times can vary). As data can be allocated for different performance requirements, a plurality of re-writeable cells can be used for different data types. Moreover, memory cells can be assigned for different levels of cache hierarchies (e.g., L1, L2, L3 cache), as described above.

Finally, as mentioned above, more than one memory array, more than one type of logic circuitry, and both memory array(s) and logic circuitry can be placed in the substrate under the three-dimensional memory array. For example, two different memory arrays and two different host device interface circuitry can be formed in a substrate below a three-dimensional memory array.

It is intended that the foregoing detailed description be understood as an illustration of selected forms that the invention can take and not as a definition of the invention. It is only the following claims, including all equivalents, that are intended to define the scope of this invention. Finally, it should be noted that any aspect of any of the preferred embodiments described herein can be used alone or in combination with one another.

What is claimed is:

1. An integrated circuit comprising:
   a substrate;
   a three-dimensional memory array comprising a plurality of layers of memory cells stacked vertically above one another and above the substrate;
   support circuitry for the three-dimensional memory array, the support circuitry formed in the substrate at least partially under the three-dimensional memory array, the support circuitry defining open area in the substrate under the three-dimensional memory array; and
   a second memory array formed at least partially in the open area in the substrate under the three-dimensional memory array.

2. The invention of claim 1 further comprising wire connections to the second memory array passing through the support circuitry for the three-dimensional memory array.

3. The invention of claim 1, wherein the second memory array is partitioned into multiple parts and more than one part is accessed in parallel.

4. The invention of claim 1, wherein the three-dimensional memory array and the second memory array are partitioned into banks, and wherein one or more banks are accessed in parallel.

5. The invention of claim 1, wherein the three-dimensional memory array is organized in a plurality of sub-arrays, and wherein the second memory array is formed at least partially in the substrate between the support circuitry for at least one of the sub-arrays.

6. The invention of claim 1, wherein the three-dimensional memory array is organized in a plurality of sub-arrays of first and second types, the first type being above bit line support circuitry and the second type being above word line support circuitry, wherein the second memory array is formed at least partially in the substrate under at least one of the first and second types of sub-arrays.

7. The invention of claim 1, wherein the second memory array is completely surrounded by the support circuitry.

8. The invention of claim 1, wherein the second memory array is partially surrounded by the support circuitry.

9. The invention of claim 1, wherein the support circuitry comprises a multi-headed driver decode circuit.

10. The invention of claim 1 further comprising a third memory array formed at least partially in the open area in the substrate under the three-dimensional memory array.

11. The invention of claim 1 further comprising logic circuitry formed at least partially in the open area in the substrate under the three-dimensional memory array.

12. The invention of claim 1, wherein the second memory array comprises a cache memory.

13. The invention of claim 1, wherein the three-dimensional memory array comprises non-volatile memory cells, and wherein the second memory array comprises volatile memory cells.

14. The invention of claim 1, wherein both the three-dimensional memory array and the second memory array comprise non-volatile memory cells.

15. The invention of claim 1, wherein the three-dimensional memory array stores data, and wherein the second memory array stores code.

16. The invention of claim 1, wherein the three-dimensional memory array is configured as NAND memory, and wherein the second memory array is configured as NOR memory.

17. The invention of claim 1, wherein at least some memory cells of the second memory array are pitch-matched to at least some memory cells of the three-dimensional memory array.

18. The invention of claim 1, wherein the integrated circuit is part of a modular memory device that is removably connectable to a host device.

19. The invention of claim 1, wherein the memory cells of one of the three-dimensional memory array and the second memory array comprises field-programmable write-once memory cells, and wherein the other of the three-dimensional memory array and the second memory array comprises field-programmable re-writable memory cells.

20. The invention of claim 1, wherein the memory cells of the three-dimensional memory array and the second memory array have different write times.

21. The invention of claim 1, wherein the memory cells of the three-dimensional memory array and the second memory array have different read times.

22. The invention of claim 1, wherein the memory cells of one of the three-dimensional memory array and the second memory array are programmed during manufacturing, and wherein the other of the three-dimensional memory array and the second memory array are programmed in the field.

23. The invention of claim 22, wherein the memory cells programmed during manufacturing store register settings, and wherein the memory cells programmed in the field store data.

24. The invention of claim 1, wherein the memory cells of the three-dimensional memory array store a different data type than the memory cells of the second memory array.

25. The invention of claim 24, wherein the memory cells of the three-dimensional memory array store a file system structure, and wherein the memory cells of the second memory array store a digital media file.

26. The invention of claim 24, wherein the memory cells of the three-dimensional memory array are assigned a different level of cache hierarchy than the memory cells of the second memory array.

27. An integrated circuit comprising:
    a substrate;
    a three-dimensional memory array comprising a plurality of layers of memory cells stacked vertically above one another and above the substrate;
    support circuitry for the three-dimensional memory array, the support circuitry formed in the substrate at least partially under the three-dimensional memory array, the
    support circuitry defining open area in the substrate under the three-dimensional memory array; and
    logic circuitry formed at least partially in the open area in the substrate under the three-dimensional memory array.

28. The invention of claim 27, wherein wire connections to the logic circuitry pass through the support circuitry for the three-dimensional memory array.

29. The invention of claim 27 further comprising a second memory array formed at least partially in the open area in the substrate under the three-dimensional memory array.

30. The invention of claim 27, wherein the logic circuitry comprises host device interface circuitry.

31. The invention of claim 30, wherein the logic circuitry comprises second host device interface circuitry.

32. The invention of claim 27, wherein the logic circuitry comprises an ISA interface operative to allow the three-dimensional memory array to behave as a disk drive.

33. The invention of claim 27, wherein the logic circuitry comprises an audio decoder.

34. The invention of claim 27, wherein the logic circuitry comprises a microprocessor.

35. The invention of claim 27, wherein the integrated circuit is part of a modular memory device that is removably connectable to a host device.

* * * * *